(12) United States Patent
Oh

(10) Patent No.: US 12,710,389 B2
(45) Date of Patent: Aug. 18, 2026

(54) ELECTRONIC DEVICE INCLUDING DEW CONDENSATION SENSOR

(71) Applicant: LG ELECTRONICS INC., Seoul (KR)

(72) Inventor: Kyungsup Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 218 days.

(21) Appl. No.: 18/687,732

(22) PCT Filed: Sep. 17, 2021

(86) PCT No.: PCT/KR2021/012811
§ 371 (c)(1),
(2) Date: Feb. 28, 2024

(87) PCT Pub. No.: WO2023/042940
PCT Pub. Date: Mar. 23, 2023

(65) Prior Publication Data

US 2025/0137962 A1 May 1, 2025

(51) Int. Cl.
*G01N 27/22* (2006.01)
*G01R 31/28* (2006.01)
(Continued)

(52) U.S. Cl.
CPC ......... *G01N 27/223* (2013.01); *G01N 27/228* (2013.01); *G01R 31/2817* (2013.01);
(Continued)

(58) Field of Classification Search
CPC .. G01N 27/223; G01N 27/228; G01N 25/142; G01R 31/2817; G01R 31/2818;
(Continued)

(56) References Cited

U.S. PATENT DOCUMENTS 5,306,590 A * 4/1994 Felder ...................... G03G 9/12 430/137.22
8,049,512 B2 * 11/2011 Jow ...................... H05K 1/0268 324/540
(Continued)

FOREIGN PATENT DOCUMENTS

CN 110554070 12/2019
JP 2000171874 6/2000
(Continued)

OTHER PUBLICATIONS

PCT International Application No. PCT/KR2021/012811, International Search Report dated Jun. 9, 2022, 9 pages.

*Primary Examiner* — Giovanni Astacio-Oquendo
(74) *Attorney, Agent, or Firm* — LEE, HONG, DEGERMAN, KANG & WAIMEY

(57) ABSTRACT

An electronic device may comprise: a case made of a metal material; a circuit board positioned on a surface of the case; a dew condensation sensor which includes a pair of sensor electrodes formed on the circuit board while forming a predetermined gap therebetween and detects dew condensation formation when a current flows between the sensor electrodes; and a control part for locking to prevent driving when the dew condensation sensor detects dew condensation, and may prevent malfunction or damage of components by detecting the dew condensation in an early stage.

13 Claims, 12 Drawing Sheets

(51) Int. Cl.

| | |
|---|---|
| ***G08B 21/20*** | (2006.01) |
| ***G09G 3/00*** | (2006.01) |
| ***H05K 1/02*** | (2006.01) |
| ***H05K 1/16*** | (2006.01) |

(52) U.S. Cl.
CPC ............. *G08B 21/20* (2013.01); *G09G 3/006* (2013.01); *H05K 1/0268* (2013.01); *H05K 1/162* (2013.01); *H05K 2201/10151* (2013.01)

(58) Field of Classification Search
CPC .... G01R 31/2849; G08B 21/20; G09G 3/006; H05K 1/0268; H05K 1/162; H05K 2201/10151; H04N 5/44; H04N 5/63
USPC ......................... 324/664, 663, 658, 649, 600
See application file for complete search history.

(56) References Cited

U.S. PATENT DOCUMENTS

| | | | | |
|---|---|---|---|---|
| 2008/0155851 | A1* | 7/2008 | Niebe | D21F 5/00 162/252 |
| 2009/0161325 | A1* | 6/2009 | Kirmayer | H05K 1/0268 361/752 |
| 2018/0074115 | A1* | 3/2018 | Crynock | G01R 31/2812 |
| 2018/0096869 | A1* | 4/2018 | Yoshida | H01L 21/6831 |
| 2018/0284171 | A1* | 10/2018 | Sugita | G01R 27/2605 |
| 2019/0384034 | A1* | 12/2019 | Min | H02K 41/0356 |
| 2020/0096225 | A1* | 3/2020 | Sawada | F24F 11/89 |
| 2020/0284745 | A1* | 9/2020 | Rauwolf | G01N 27/223 |
| 2021/0185201 | A1* | 6/2021 | Ta Van | H04N 23/54 |
| 2024/0201118 | A1* | 6/2024 | Lo | G01N 27/226 |

FOREIGN PATENT DOCUMENTS

| | | | | |
|---|---|---|---|---|
| JP | 2000171874 A | * | 6/2000 | |
| JP | 2007178175 | | 7/2007 | |
| JP | 2007178175 A | * | 7/2007 | |
| KR | 100650603 | | 11/2006 | |
| KR | 100650603 B1 | * | 11/2006 | H01L 21/225 |

* cited by examiner

FIG. 3

| Sensing | Width | level |
|---|---|---|
| #1 | 0.1mm | Low |
| #2 | 0.3mm | |
| #3 | 0.5mm | Middle |
| #4 | 0.7mm | |
| #5 | 0.9mm | High |

| | GPIO |
|---|---|
| Normal | Low |
| Dew con. | High |

ELECTRONIC DEVICE INCLUDING DEW CONDENSATION SENSOR

CROSS-REFERENCE TO RELATED APPLICATION(S)

This application is the National Stage filing under 35 U.S.C. 371 of International Application No. PCT/KR2021/012811, filed on Sep. 17, 2021, the contents of which are all incorporated by reference herein in its entirety.

TECHNICAL FIELD

The present disclosure relates to an electronic device detecting and coping with condensation.

BACKGROUND

With growth of information society, demand for various display devices has increased. In order to satisfy such demand, in recent years, a liquid crystal display (LCD), a field emission display (FED), a plasma display panel (PDP), and an electroluminescent device have been developed as display devices.

A liquid crystal panel of the liquid crystal display includes a liquid crystal layer and a TFT substrate and a color filter substrate opposite each other in the state in which the liquid crystal layer is interposed therebetween, wherein a picture is displayed using light provided from a backlight unit.

An active matrix type organic light-emitting display has come onto the market as an example of the electroluminescent device. Since the organic light-emitting display is self-emissive, the organic light-emitting display has no backlight, compared to the liquid crystal display, and has merits in terms of response time and viewing angle, and therefore the organic light-emitting display has attracted attention as a next-generation display.

When the organic light-emitting display is used as a display panel, the organic light-emitting display itself is made of a flexible material, the rigidity of a module cover supporting the organic light-emitting display is important.

The display device may be mounted indoors or outdoors, and may be used in an area in which a daily temperature range is large or an annual temperature range depending on a region.

In particular, when the display device is used in a high-temperature and high-humidity region, condensation may occur, and when a dew drop penetrates a component, defects and malfunction may occur.

DISCLOSURE

Technical Problem

An object of the present disclosure is to provide an electronic device for detecting condensation to minimize malfunction and defects caused by condensation and coping with the condensation.

Technical Solution

According to an embodiment of the present disclosure, an electronic device includes a case including a metal material, a circuit board located on a surface of the case, a condensation sensor including a pair of sensor electrodes formed to form a predetermined gap on the circuit board and configured to detect occurrence of condensation based on a current flowing between the sensor electrodes, and a controller configured to lock an operation of the electronic device based on detection of the condensation by the condensation sensor.

The gap may be less than or equal to 0.1 mm and equal to or less than 1 mm.

The condensation sensor may include a plurality of condensation sensors with different gaps.

The plurality of condensation sensors may be arranged in a horizontal direction.

The plurality of condensation sensors may include a first condensation sensor having a first gap, and a second condensation sensor having a second gap with a smaller size than the first gap, wherein the controller is configured to lock driving of the electronic device based on detection of condensation by the first condensation sensor and provide a condensation guide to inform a user of occurrence of condensation based on detection of condensation by the second condensation sensor.

The electronic device may further include a display module, and the controller may drive a light source of the display module and alert the user of a locked state of driving based on detection of condensation by the first condensation sensor.

The controller may store a condensation detection result as a condensation history based on detection of condensation by the condensation sensor.

The gap may have a wide upper portion and a narrow lower portion.

A surface of the circuit board may include a photo solder resist (PSR), and the PSR may be removed from the gap.

The condensation sensor may be located below a portion of the circuit board, through which soldering or a copper foil is exposed.

The circuit board may further include a sensor board located below the case, and the condensation sensor may be located at an upper end of the sensor board.

The case may further include a condensation groove located above the sensor board The sensor board may include a material with a higher thermal conductivity than copper.

The electronic device may further include a cable connector located on the circuit board and including a plurality of electrodes, and a sensor electrode of the condensation sensor may be a pair of electrodes located on the connector.

Advantageous Effects

The electronic device according to the present disclosure may prevent malfunction or damage to components by early sensing condensation.

It may be possible to implement a condensation sensor by utilizing an existing structure without using a component in which additional costs such as a separate moisture sensor and a temperature humidity sensor are generated, thereby minimizing addition of costs.

A condensation occurrence condition in which condensation occurs may be checked by recording a condensation history, thereby coping with occurrence of condensation.

Effects obtainable from the present disclosure may be non-limited by the above-mentioned effects. And, other unmentioned effects can be clearly understood from the following description by those having ordinary skill in the technical field to which the present disclosure pertains.

BRIEF DESCRIPTION OF THE DRAWINGS

FIG. 3 is an exploded perspective view showing the example of the display device according to the present disclosure;

DETAILED DESCRIPTION

Figure 1:
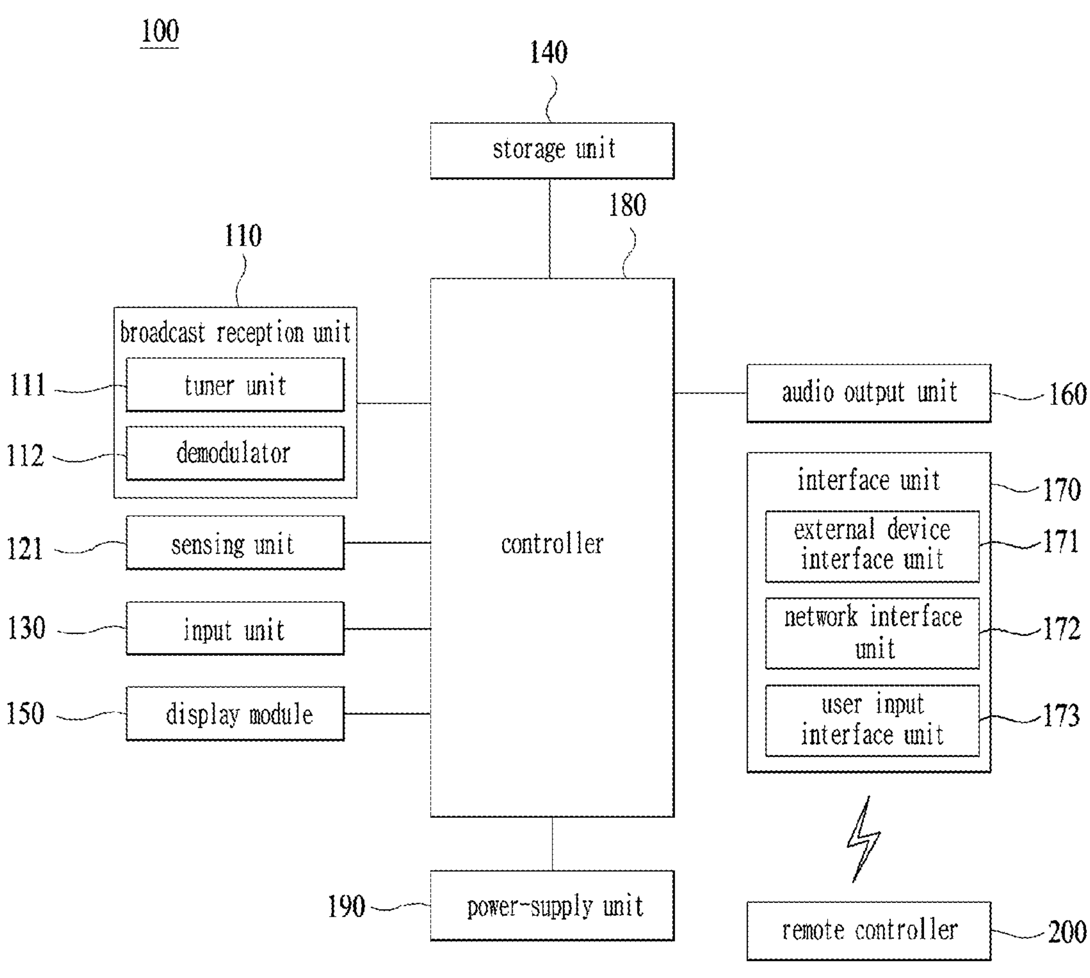
FIG. 1 is a block diagram illustrating components of a display device according to the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Meanwhile, an image display device described in this specification is, for example, an intelligent image display device having a computer supporting function in addition to a broadcast reception function, wherein an Internet function may be added while the broadcast reception function is devotedly performed, whereby an interface that is more conveniently used, such as a handwriting type input device, a touchscreen, or a space remote control, may be provided. In addition, the image display device may be connected to the Internet or a computer through support of a wired or wireless Internet function, whereby various functions, such as e-mail, web browsing, banking, or gaming, may be executed. For such various functions, a standardized general-purpose OS may be used.

In the image display device described in the present disclosure, therefore, various applications may be freely added or deleted, for example, on a general-purpose OS kernel, whereby various user friendly functions may be executed. More specifically, the image display device may be a network TV, an Hbb TV, or a smart TV, and is applicable to a smartphone depending on circumstances.

FIG. 1 is a block diagram illustrating components of a display device 100. The display device 100 may include a broadcast reception unit 110, an external device interface unit 171, a network interface unit 172, a storage unit 140, a user input interface unit 173, an input unit 130, a controller 180, a display module 150, an audio output unit 160, and/or a power supply unit 190.

The broadcast reception unit 110 may include a tuner unit 111 and a demodulation unit 112.

Unlike the figure, on the other hand, the display device 100 may include only the external device interface unit 171 and the network interface unit 172, among the broadcast reception unit 110, the external device interface unit 171, and the network interface unit 172. That is, the display device 100 may not include the broadcast reception unit 110.

The tuner unit 111 may select a broadcast signal corresponding to a channel selected by a user or any one of all pre-stored channels, among broadcast signals received through an antenna (not shown) or a cable (not shown). The tuner unit 111 may convert the selected broadcast signal into an intermediate frequency signal or a baseband video or audio signal.

For example, when the selected broadcast signal is a digital broadcast signal, the tuner unit 111 may convert the broadcast signal into a digital IF (DIF) signal, and when the selected broadcast signal is an analog broadcast signal, the tuner unit 111 may convert the broadcast signal into an analog baseband video or audio (CVBS/SIF) signal. That is, the tuner unit 111 may process the digital broadcast signal or the analog broadcast signal. The analog baseband video or audio (CVBS/SIF) signal output from the tuner unit 111 may be directly input to the controller 180.

Meanwhile, the tuner unit 111 may sequentially select broadcast signals of all broadcast channels stored through a channel memory function, among received broadcast signals, and may convert each of the selected broadcast signals into an intermediate frequency signal or a baseband video or audio signal.

Meanwhile, the tuner unit 111 may include a plurality of tuners in order to receive broadcast signals of a plurality of channels. Alternatively, a single tuner may simultaneously receive broadcast signals of a plurality of channels.

The demodulation unit 112 may receive the digital IF (DIF) signal converted by the tuner unit 111, and may perform demodulation. After performing demodulation and channel decryption, the demodulation unit 112 may output a stream signal (TS). At this time, the stream signal may be a multiplexed image, audio, or data signal.

The stream signal output from the demodulation unit 112 may be input to the controller 180. After performing demultiplexing and image/audio signal processing, the controller 180 may output an image through the display module 150, and may output audio through the audio output unit 160.

The sensing unit 120 is a device configured to sense change inside or outside the display device 100. For example, the sensing unit 120 may include at least one of a proximity sensor, an illumination sensor, a touch sensor, an infrared (IR) sensor, an ultrasonic sensor, an optical sensor (e.g. a camera), an audio sensor (e.g. a microphone), a battery gauge, and an environmental sensor (e.g. a hygrometer or a thermometer).

The controller 180 may check the state of the display device 100 based on information collected by the sensing unit, and when a problem occurs, may inform a user of the same or may solve the problem, whereby the controller may perform control such that the display device is maintained in the best state.

In addition, the controller may differently control the content, quality, and size of an image provided to the display module 150 based on a viewer or ambient light sensed by the sensing unit in order to provide the optimum viewing environment. With progress of a smart TV, a large number of functions have been loaded in the display device, and the sensing unit 20 has also been increased in number.

The input unit 130 may be provided at one side of a main body of the display device 100. For example, the input unit 130 may include a touchpad or a physical button. The input unit 130 may receive various user commands related to the operation of the display device 100, and may transmit control signals corresponding to the received commands to the controller 180.

With a decrease in size of a bezel of the display device 100, many display devices 100 have been configured such that the number of physical button type input units 130 exposed to the outside is minimized in recent years. Instead, a minimum number of physical buttons is located at the rear surface or the side surface of the display device, and the display device may receive user input through the touchpad or the user input interface unit 173, a description of which will follow, using a remote controller 200.

The storage unit 140 may store programs for signal processing and control in the controller 180, and may store a processed image, audio, or data signal. For example, the storage unit 140 may store application programs designed to execute various tasks that can be processed by the controller 180, and may selectively provide some of the stored application programs in response to request of the controller 180.

Programs stored in the storage unit 140 are not particularly restricted as long as the programs can be executed by the controller 180. The storage unit 140 may temporarily store an image, audio, or data signal received from an external device through the external device interface unit 171. The storage unit 140 may store information about a predetermined broadcast channel through a channel memory function, such as a channel map.

FIG. 1 shows an embodiment in which the storage unit 140 and the controller 180 are separately provided; however, the present disclosure is not limited thereto. The storage unit 140 may be included in the controller 180.

The storage unit 140 may include at least one of a volatile memory (e.g. DRAM, SRAM, or SDRAM), a nonvolatile memory (e.g. flash memory), a hard disk drive (HDD), and a solid-state drive (SSD). The display module 150 may convert an image signal, a data signal, an OSD signal, and a control signal processed by the controller 180 or an image signal, a data signal, and a control signal received from the interface unit 171 to generate a driving signal. The display module 150 may include a display panel 181 having a plurality of pixels.

Each of the plurality of pixels in the display panel may include RGB subpixels. Alternatively, each of the plurality of pixels in the display panel may include RGBW subpixels. The display module 150 may convert an image signal, a data signal, an OSD signal, and a control signal processed by the controller 180 to generate a driving signal for the plurality of pixels.

A plasma display panel (PDP), a liquid crystal display (LCD), an organic light-emitting diode (OLED), or a flexible display may be used as the display module 150, and a 3D display may also be used. The 3D display 130 may be classified as a non-glasses type display or a glasses type display.

Meanwhile, the display module 150 may be constituted by a touchscreen, whereby an input device may also be used in addition to an output device.

The audio output unit 160 receives an audio signal processed by the controller 180 and outputs the same as audio.

The interface unit 170 serves as a path to various kinds of external devices connected to the display device 100. The interface unit may include a wireless system using an antenna as well as a wired system configured to transmit and receive data through a cable.

The interface unit 170 may include at least one of a wired/wireless headset port, an external charger port, a wired/wireless data port, a memory card port, a port for connection with a device having an identification module, an audio input/output (I/O) port, a video input/output (I/O) port, and an earphone port.

The broadcast reception unit 110 may be included as an example of the wireless system, and a mobile communication signal, a short-range communication signal, and a wireless Internet signal as well as a broadcast signal may be included.

The external device interface unit 171 may transmit or receive data to or from a connected external device. To this end, the external device interface unit 171 may include an A/V input and output unit (not shown).

The external device interface unit 171 may be connected to an external device, such as a digital versatile disc (DVD) player, a Blu-ray player, a game console, a camera, a camcorder, a computer (laptop computer), or a set-top box, in wired/wireless manner, and may perform input/output operation for the external device.

In addition, the external device interface unit 171 may establish a communication network with various remote controllers 200 in order to receive a control signal related to the operation of the display device 100 from each remote controller 200 or to transmit data related to the operation of the display device 100 to each remote controller 200.

The external device interface unit 171 may include a wireless communication unit (not shown) for short-range wireless communication with another electronic device. The external device interface unit 171 may exchange data with a mobile terminal adjacent thereto through the wireless communication unit (not shown). Particularly, in a mirroring mode, the external device interface unit 171 may receive device information, information of an application that is executed, and an image of the application from the mobile terminal.

The network interface unit 172 may provide an interface for connection of the display device 100 with a wired/ wireless network including the Internet. For example, the network interface unit 172 may receive content or data provided by an Internet or content provider or a network operator through the network. Meanwhile, the network interface unit 172 may include a communication module (not shown) for connection with the wired/wireless network.

The external device interface unit 171 and/or the network interface unit 172 may include a communication module for short-range communication, such as Wi-Fi, Bluetooth, Bluetooth Low Energy (BLE), ZigBee, or Near Field Communication (NFC), or a communication module for cellular communication, such as Long-Term Evolution (LTE), LTE Advance (LTE-A), Code Division Multiple Access (CDMA), Wideband CDMA (WCDMA), Universal Mobile Telecommunications System (UMTS), or Wireless Broadband (WiBro).

The user input interface unit 173 may transmit a user input signal to the controller 180, or may transmit a signal from the controller 180 to a user. For example, the user input interface unit may transmit/receive a user input signal, such as power on/off, channel selection, or screen setting, to/from the remote controller 200, may transmit a user input signal, such as a power key, a channel key, a volume key, or a setting value, input from a local key (not shown) to the controller 180, may transmit a user input signal input from a sensor unit (not shown) configured to sense user gesture to the controller 180, or may transmit a signal from the controller 180 to the sensor unit.

The controller 180 may include at least one processor, and may control the overall operation of the display device 100 using the processor included therein. Here, the processor may be a general processor, such as a central processing unit (CPU). Of course, the processor may be a dedicated device, such as an ASIC, or another hardware-based processor.

The controller 180 may demultiplex a stream input through the tuner unit 111, the demodulation unit 112, the external device interface unit 171, or the network interface unit 172, or may process demultiplexed signals to generate and output a signal for image or audio output.

An image signal processed by the controller 180 may be input to the display module 150, which may display an image corresponding to the image signal. In addition, the image signal processed by the controller 180 may be input to an external output device through the external device interface unit 171.

An audio signal processed by the controller 180 may be output through the audio output unit 160. In addition, the audio signal processed by the controller 180 may be input to an external output device through the external device interface unit 171. Although not shown in FIG. 2, the controller 180 may include a demultiplexing unit and an image processing unit, which will be described below with reference to FIG. 3.

Further, the controller 180 may control the overall operation of the display device 100. For example, the controller 180 may control the tuner unit 111 such that a broadcast corresponding to a channel selected by a user or a pre-stored channel is tuned.

In addition, the controller 180 may control the display device 100 according to a user command input through the user input interface unit 173 or an internal program. Meanwhile, the controller 180 may control the display module 150 to display an image. At this time, the image displayed on the display module 150 may be a still image or video, or may be a 2D image or a 3D image.

Meanwhile, the controller 180 may perform control such that a predetermined 2D object is displayed in an image displayed on the display module 150. For example, the object may be at least one of a connected web screen (newspaper or magazine), an electronic program guide (EPG), various menus, a widget, an icon, a still image, video, and text.

Meanwhile, the controller 180 may modulate and/or demodulate a signal using an amplitude shift keying (ASK) method. Here, the amplitude shift keying (ASK) method may be a method of changing the amplitude of a carrier depending on a data value to modulate a signal or restoring an analog signal to a digital data value depending on the amplitude of a carrier.

For example, the controller 180 may modulate an image signal using the amplitude shift keying (ASK) method, and may transmit the modulated image signal through a wireless communication module.

For example, the controller 180 may demodulate and process an image signal received through the wireless communication module using the amplitude shift keying (ASK) method.

As a result, the display device 100 may easily transmit and receive a signal to and from another image display device disposed adjacent thereto without using a unique identifier, such as a media access control (MAC) address, or a complicated communication protocol, such as TCP/IP.

Meanwhile, the display device 100 may further include a photographing unit (not shown). The photographing unit may photograph a user. The photographing unit may be implemented by one camera; however, the present disclosure is not limited thereto. The photographing unit may be implemented by a plurality of cameras. Meanwhile, the photographing unit may be embedded in the display device 100 above the display module 150, or may be separately disposed. Image information photographed by the photographing unit may be input to the controller 180.

The controller 180 may recognize the location of a user based on an image captured by the photographing unit. For example, the controller 180 may recognize the distance between the user and the display device 100 (z-axis coordinate). Further, the controller 180 may recognize an x-axis coordinate and a y-axis coordinate in the display module 150 corresponding to the location of the user.

The controller 180 may sense user gesture based on the image captured by the photographing unit, a signal sensed by the sensor unit, or a combination thereof.

The power supply unit 190 may supply power to the components of the display device 100. In particular, the power supply unit may supply power to the controller 180, which may be implemented in the form of a system on chip (SOC), the display module 150 for image display, and the audio output unit 160 for audio output.

Specifically, the power supply unit 190 may include an AC/DC converter (not shown) configured to convert AC power into DC power and a DC/DC converter (not shown) configured to convert the level of the DC power.

Meanwhile, the power supply unit 190 serves to distribute power supplied from the outside to the respective components of the display device. The power supply unit 190 may be directly connected to an external power supply in order to supply AC power, or may include a battery so as to be used by charging.

In the former case, a cable is used, and the power supply unit is difficult to move or the movement range of the power supply unit is limited. In the latter case, the power supply unit is free to move, but the weight of the power supply unit is increased in proportion to the weight of the battery, the volume of the power supply unit is increased, and, for charging, the power supply unit must be directly connected to a power cable or must be coupled to a charging holder (not shown) that supplies power for a predetermined time.

The charging holder may be connected to the display device through a terminal exposed to the outside, or the battery mounted in the power supply unit may be charged in a wireless manner when the power supply unit approaches the charging holder.

The remote controller 200 may transmit user input to the user input interface unit 173. To this end, the remote controller 200 may use Bluetooth communication, radio frequency (RF) communication, infrared radiation communication, ultra-wideband (UWB) communication, or ZigBee communication. In addition, the remote controller 200 may receive an image, audio, or data signal output from the user input interface unit 173 so as to be displayed thereon or audibly output therefrom.

Meanwhile, the display device 100 may be a stationary or movable digital broadcast receiver capable of receiving a digital broadcast.

Meanwhile, the block diagram of the display device 100 shown in FIG. 1 is for an embodiment of the present disclosure, and elements of the block diagram may be integrated, added, or omitted depending on specifications of an actually implemented display device 100.

That is, two or more elements may be integrated into one element, or one element may be divided into two or more elements, as needed. In addition, the function performed by each block is for describing the embodiment of the present disclosure, and the specific operations and components thereof do not limit the scope of rights of the present disclosure.

Figure 2:
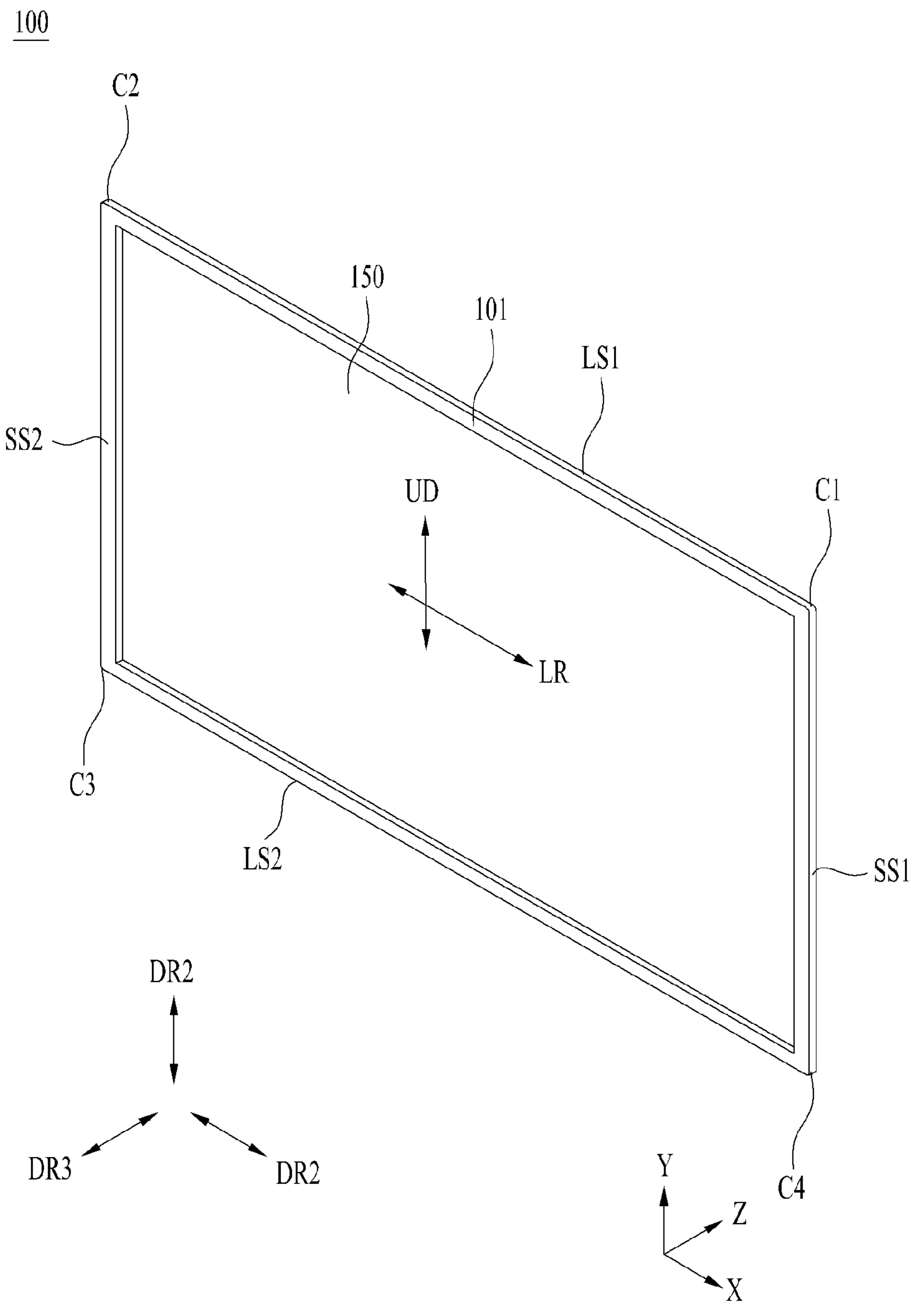
FIG. 2 is a perspective view showing an example of the display device according to the present disclosure.

FIG. 2 is a front perspective view showing an example of the display device.

Referring to FIG. 2, the display device 100 may have a rectangular shape including a first long side LS1, a second long side LS2 opposite the first long side LS1, a first short side SS1 adjacent to the first long side LS1 and the second long side LS2, and a second short side SS2 opposite the first short side SS1.

Here, the area of the first short side SS1 may be referred to as a first side area, the area of the second short side SS2 may be referred to as a second side area opposite the first side area, the area of the first long side LS1 may be referred to as a third side area adjacent to the first side area and the second side area and located between the first side area and the second side area, and the area of the second long side LS2 may be referred to as a fourth side area adjacent to the first side area and the second side area, located between the first side area and the second side area, and opposite the third side area.

In addition, the lengths of the first and second long sides LS1 and LS2 are shown and described as being greater than the lengths of the first and second short sides SS1 and SS2, for convenience of description; however, the lengths of the first and second long sides LS1 and LS2 may be approximately equal to the lengths of the first and second short sides SS1 and SS2.

Also, in the following description, a first direction DR1 may be a direction parallel to the long sides LS1 and LS2 of the display device 100, and a second direction DR2 may be a direction parallel to the short sides SS1 and SS2 of the display device 100. A third direction DR3 may be a direction perpendicular to the first direction DR1 and/or the second direction DR2.

From a different point of view, the side of the display device 100 on which a picture is displayed may be referred to as a front side or a front surface. When the display device 100 displays the picture, the side of the display device 100 from which the picture cannot be viewed may be referred to as a rear side or a rear surface. When viewing the display device 100 from the front side or the front surface, the side of the first long side LS1 may be referred to as an upper side or an upper surface. In the same manner, the side of the second long side LS2 may be referred to as a lower side or a lower surface. In the same manner, the side of the first short side SS1 may be referred to as a right side or a right surface, and the side of the second short side SS2 may be referred to as a left side or a left surface.

In addition, the first long side LS1, the second long side LS2, the first short side SS1, and the second short side SS2 may be referred to edges 351 of the display device 100. In addition, points at which the first long side LS1, the second long side LS2, the first short side SS1, and the second short side SS2 are joined to each other may be referred to as corners. For example, a point at which the first long side LS1 and the first short side SS1 are joined to each other may be a first corner C1, a point at which the first long side LS1 and the second short side SS2 are joined to each other may be a second corner C2, a point at which the second short side SS2 and the second long side LS2 are joined to each other may be a third corner C3, and a point at which the second long side LS2 and the first short side SS1 are joined to each other may be a fourth corner C4.

Here, a direction from the first short side SS1 to the second short side SS2 or a direction from the second short side SS2 to the first short side SS1 may be referred to as a leftward-rightward direction LR. A direction from the first long side LS1 to the second long side LS2 or a direction from the second long side LS2 to the first long side LS1 may be referred to as a vertical direction UD.

The display device includes a display module, which occupies a major portion of the front surface thereof, and a case configured to cover the rear surface and the side surface of the display module, the case being configured to package the display module.

In recent years, the display device 100 has used a flexible display module 150, such as light-emitting diodes (LED) or organic light-emitting diodes (OLED), in order to implement a curved screen.

Light is supplied to an LCD, which was mainly used conventionally, through a backlight unit, since the LCD is not self-emissive. The backlight unit is a device that supplies light emitted from a light source to a liquid crystal uniformly located in front thereof. As the backlight unit has been gradually thinned, a thin LCD has been implemented. However, it is difficult to implement the backlight unit using a flexible material. If the backlight unit is curved, it is difficult to supply uniform light to the liquid crystal, whereby the brightness of a screen is changed.

In contrast, the LED or the OLED may be implemented so as to be curved, since an element constituting each pixel is self-emissive, and therefore no backlight unit is used. In addition, since each element is self-emissive, the brightness of the element is not affected even though the positional relationship between adjacent elements is changed, and therefore it is possible to implement a curved display module 150 using the LED or the OLED.

An organic light-emitting diode (OLED) panel appeared in earnest in mid 2010 and has rapidly replaced the LCD in the small- or medium-sized display market. The OLED is a display manufactured using a self-emissive phenomenon of an organic compound in which the organic compound emits light when current flows in the organic compound. The response time of the OLED is shorter than the response time of the LCD, and therefore afterimages hardly appear when video is implemented.

The OLED is an emissive display product that uses three fluorescent organic compounds having a self-emissive function, such as red, green, and blue fluorescent organic compounds and that uses a phenomenon in which electrons injected at a negative electrode and a positive electrode and particles having positive charges are combined in the organic compounds to emit light, and therefore a backlight unit, which deteriorates color, is not needed.

A light-emitting diode (LED) panel is based on technology of using one LED element as one pixel. Since it is possible to reduce the size of the LED element, compared to a conventional device, it is possible to implement a curved display module 150. The conventional device, which is called an LED TV, uses the LED as a light source of a backlight unit that supplies light to the LCD, and therefore the LED does not constitute a screen.

The display module includes a display panel and a coupling magnet, a first power supply unit, and a first signal module located at a rear surface of the display panel. The display panel may include a plurality of pixels R, G, and B. The plurality of pixels R, G, and B may be formed at intersections between a plurality of data lines and a plurality of gate lines. The plurality of pixels R, G, and B may be disposed or arranged in a matrix form.

For example, the plurality of pixels R, G, and B may include a red subpixel 'R', a green subpixel 'G', and a blue subpixel 'B'. The plurality of pixels R, G, and B may include a white subpixel 'W'.

The side of the display module 150 on which a picture is displayed may be referred to as a front side or a front surface. When the display module 150 displays the picture, the side of the display module 150 from which the picture cannot be viewed may be referred to as a rear side or a rear surface.

Figure 3:
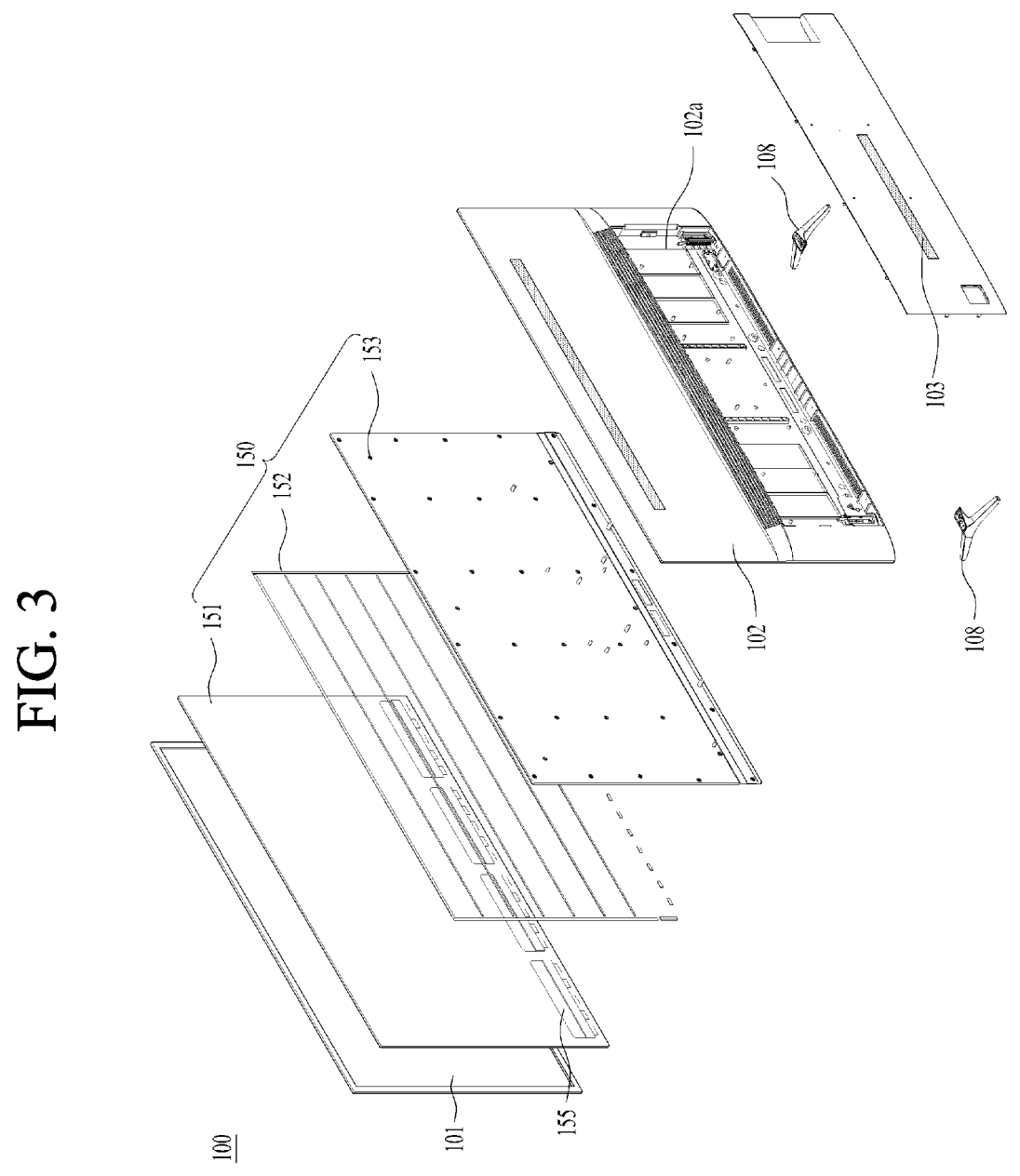

FIG. 3 is an exploded view of the display device 100. The display device may include a display module, a case top 101 covering a circumference of a front surface of the display module and surrounding a circumference of a side surface, a cover bottom 102 covering a rear surface of the display module, and a back cover 103 covering at least a portion of a rear surface of the cover bottom 102.

As the display module 150 is thinned, the case may be thinned and the thickness of the case top 101 constituting a bezel located around the front surface of the display panel may also be reduced or omitted.

Unlike a liquid crystal panel, in the case of an OLED display panel, the case top 101 may be omitted because the backlight unit is omitted and a laterally exposed layered structure is simpler than the liquid crystal display panel.

The display module includes a display panel 151 outputting an image and a support panel 153 supporting a rear surface of the display panel 151, and the two members may be coupled to each other using an adhesive member 152 such as OCA.

A flexible substrate extending from an end of the display panel 151 may be bent in a rear direction to be connected to a control board mounted on the cover bottom 102. When a liquid crystal panel is used, the display panel 151 may be formed by mounting a light source substrate, an optical sheet, and a liquid crystal panel in the stated order by using a panel guide.

A display device mounted on a wall includes a structure (not shown) fastened to the wall on the rear surface of the display device 100, and a display device that stands on the floor may include a stand 108 extending below the display module 150 of the display device 100.

Figure 4:
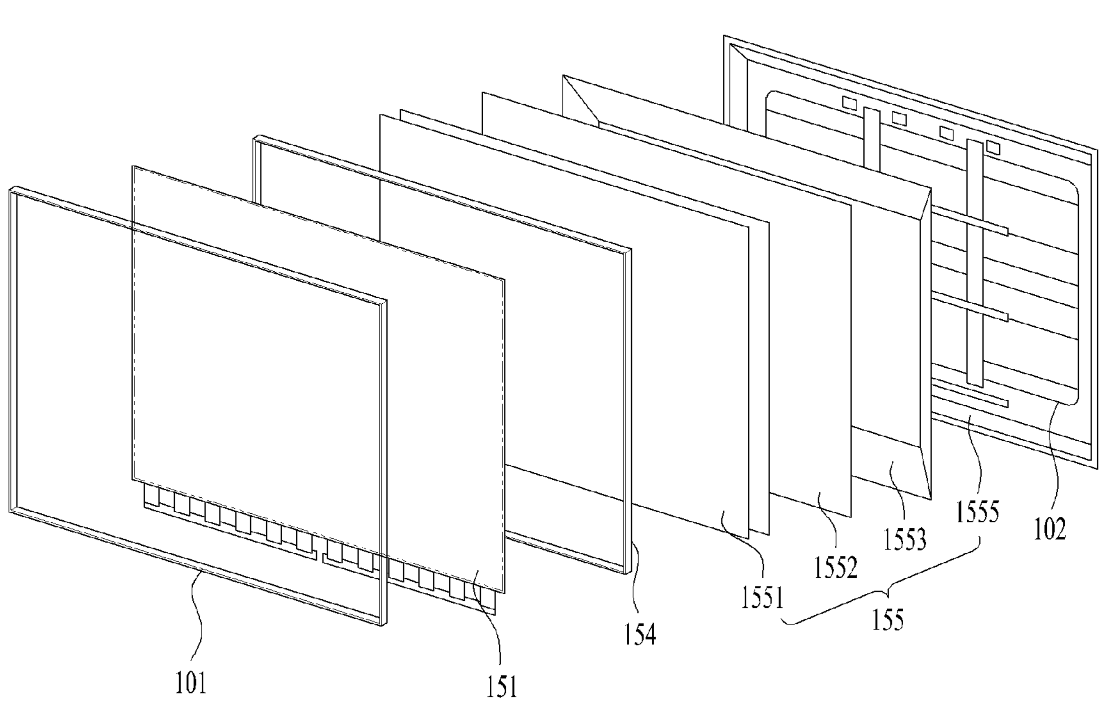
FIG. 4 is a rear perspective view showing the example of the display device according to the present disclosure.

FIG. 4 is an exploded perspective view of a liquid crystal display device 100. Referring to FIG. 4, a liquid crystal display is shown. In the case of a liquid crystal display, a liquid crystal panel 151 outputting an image and a light source supplying light from a rear surface of the liquid crystal panel 151 may be needed to include a backlight unit 155.

An LED is arranged as a light source 1555 emitting light, and a reflective sheet 1553, a light guide plate 1552, an optical sheet 1551, and the like may be disposed on a front surface of the backlight unit 155. The backlight unit 155 may further include a frame-shaped guide panel 154 disposed between the liquid crystal panel and the backlight unit 155 to align a position of each layer of the backlight unit 155 composed of several films and to align the position of each layer of the backlight unit 155 with the liquid crystal panel.

The display module 150 may be positioned between the case top 101 located on the front surface and the cover bottom 102 located on the rear surface. As the size of the display device is reduced, a space between the case top and the cover bottom 102 is narrowed, and thus the display device is vulnerable to heat dissipation.

To dissipate heat generated by the display module 150, the cover bottom 102 may use a material having a high thermal conductivity. For example, the cover bottom 102 may include a metal material and have a high thermal conductivity, and thus a temperature thereof may be lower than the surrounding temperature. In particular, if the temperature rises in the early morning while the temperature of the cover bottom 102 is low due to the temperature dropping overnight, condensation may occur because the temperature of the cover bottom 102 is lower than the surrounding temperature.

Figure 5:
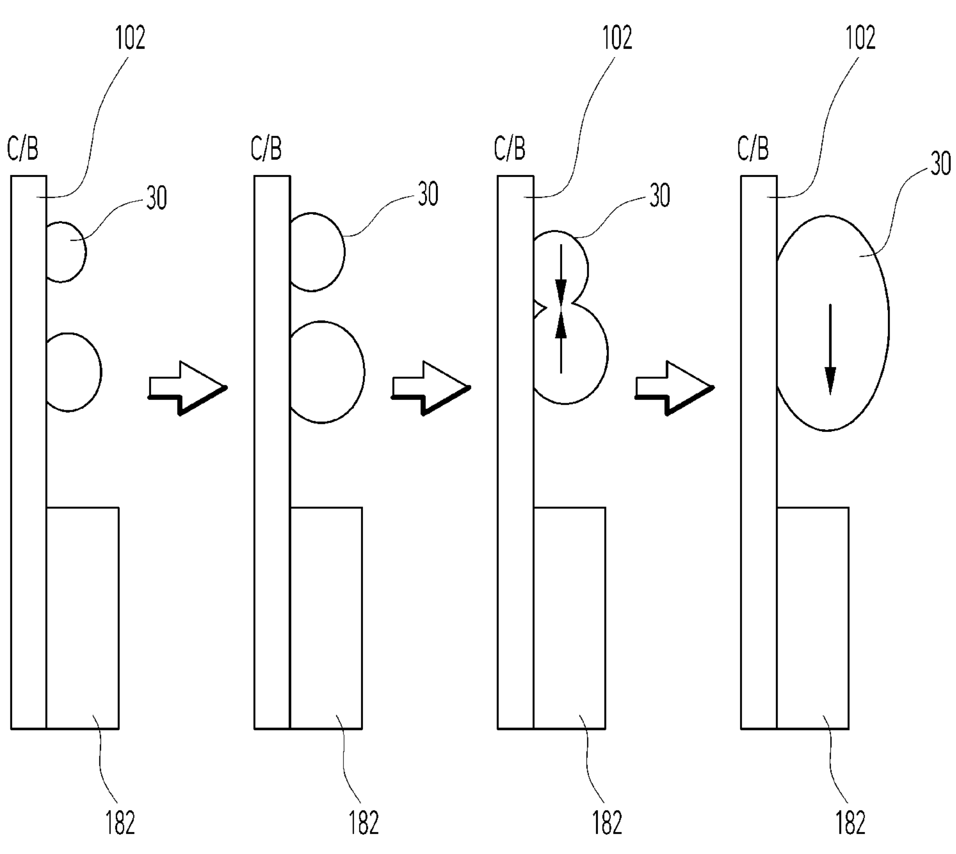
FIG. 5 is a diagram for explaining a condensation phenomenon.
Figure 5:
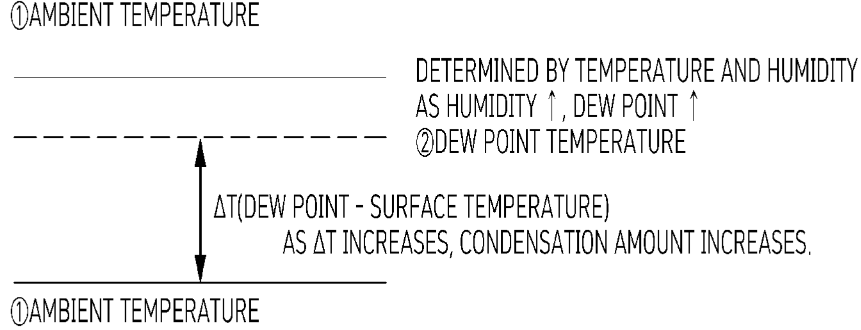

FIG. 5 is a diagram for explaining a condensation phenomenon. A dew drop 30 refers to a phenomenon, when the surface temperature of an object 102 is less than or equal to a dew point, moisture contained in the surrounding air is condensed and formed on the surface of the object 102. The dew point may vary depending on the surrounding temperature and humidity, and when the surface temperature of the object is lower than the temperature of the dew point, a degree of condensation may increase.

At first, the size of the dew drop 30 formed on the surface of the object is small, but as the dew drop 30 gradually grows and merges with a neighboring dew drop 30, and when the diameter becomes more than about 2.5 mm, the dew drop 30 flows down in a direction of gravity along the surface of the object.

Figure 6:
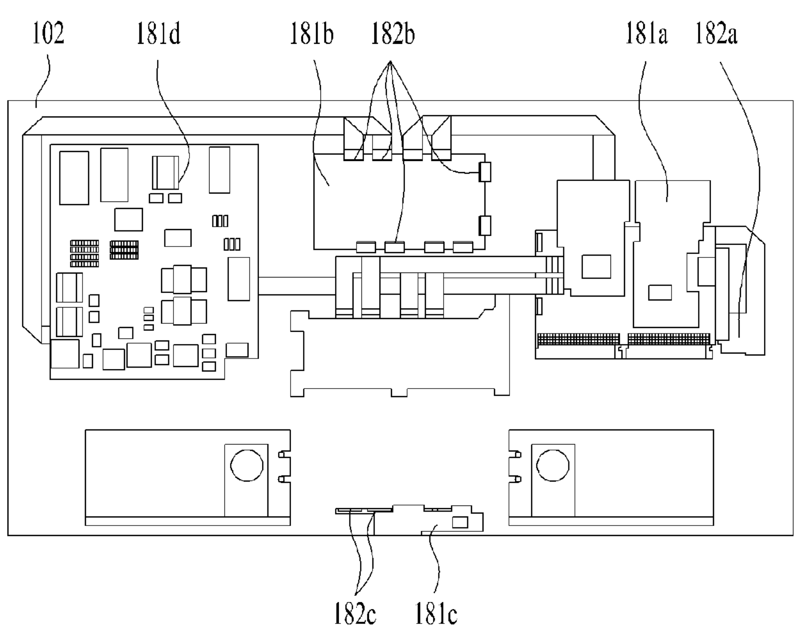
FIG. 6 is a diagram illustrating an example of an electronic component disposed on a rear surface of a cover bottom of a display device, according to the present disclosure.

FIG. 6 is a diagram illustrating an example of an electronic component disposed on a rear surface of the cover bottom 102 of the display device 100, according to the present disclosure. Electronic components 181*a*, 181*b*, 181*c*, 181*d*, 182*a*, 182*b*, and 182*c* required for controlling the display device 100 are illustrated.

A main board 181*a* for controlling the entire display device 100, a power board 181*b* distributing power, and a sensor may be mounted, or a circuit board 181 such as a sub-board 181*c* connected to the display module 150 may be positioned. Various ICs may be mounted on each circuit board, and a cable may be used to transmit and receive signals between the boards.

An electronic device such as the display device 100 needs to stably transmit a large amount of transmitted and received signals, and thus a flexible flat cable (FFC) may be used. The FFC may cover a signal line, and a plurality of signal lines may be arranged side by side by a predetermined pitch (for example, 0.3 mm, 0.5 mm, and 1.0 mm) in a horizontal direction.

A flexible printed circuit (FPC) may be used as a signal line (cable) connecting components or between the circuit boards 181*a*, 181*b*, 181*c*, and 181*d*.

The flexible printed circuit is a thin insulating polymer film having a conductive circuit pattern attached thereto and may be coated with a polymer to protect a conductor circuit, and single-layer, double-sided, multi-layered circuit lines may be arranged thereon.

The circuit board 181 may include a cable connector 182 into which a cable is inserted. The cable connector 182 may allow the cable to be easily connected and disconnected and separated via plug-in, that is, an insertion method.

The cable connector 182 has a disadvantage in that a secondary process is required and a large size is required to form an exposed terminal, but the cable connector 182 may be easily coupled and separated to be used for connection between the circuit boards 181.

The cable connector 182 to which the flexible flat cable (FFC) is coupled is exposed to the outside such that when water flows into a terminal, the cable connector 182 may cause a short circuit, and may cause malfunction, failure, or fire.

When the components are attached to the same circuit board 181 and are not separated from each other in the case of parts, soldering may be performed. For soldering, an insulating material on the surface of the circuit board 181 is removed and the copper foil is exposed, and thus when water is introduced into the exposed portion of the copper foil, a defect, a failure, and a fire may also be caused.

The electronic component mounted on the surface of the cover bottom 102 is vulnerable to the inflow of water, and thus the housing 101 and 102 may have a waterproof structure, but it is difficult to prevent condensation on the surface of the metallic member such as the cover bottom 102.

In particular, when the display device 100 is not used in a high temperature and high humidity area, the temperature of the cover bottom 102 may be relatively lowered, and particularly condensation may occur at dawn.

The present disclosure relates to the display device 100 that limits an operation of the display device 100 to guide a user to detect occurrence of condensation in advance, remove dew drops, and prevent a failure. The present disclosure is described based on a display device, but may also be applied to a general home appliance that does not include the display module 150. However, the display device 100 includes a metal having a large area like the cover bottom 102, and thus the display device 100 may be useful when being applied to the display device 100 having a high risk of condensation.

Figure 7:
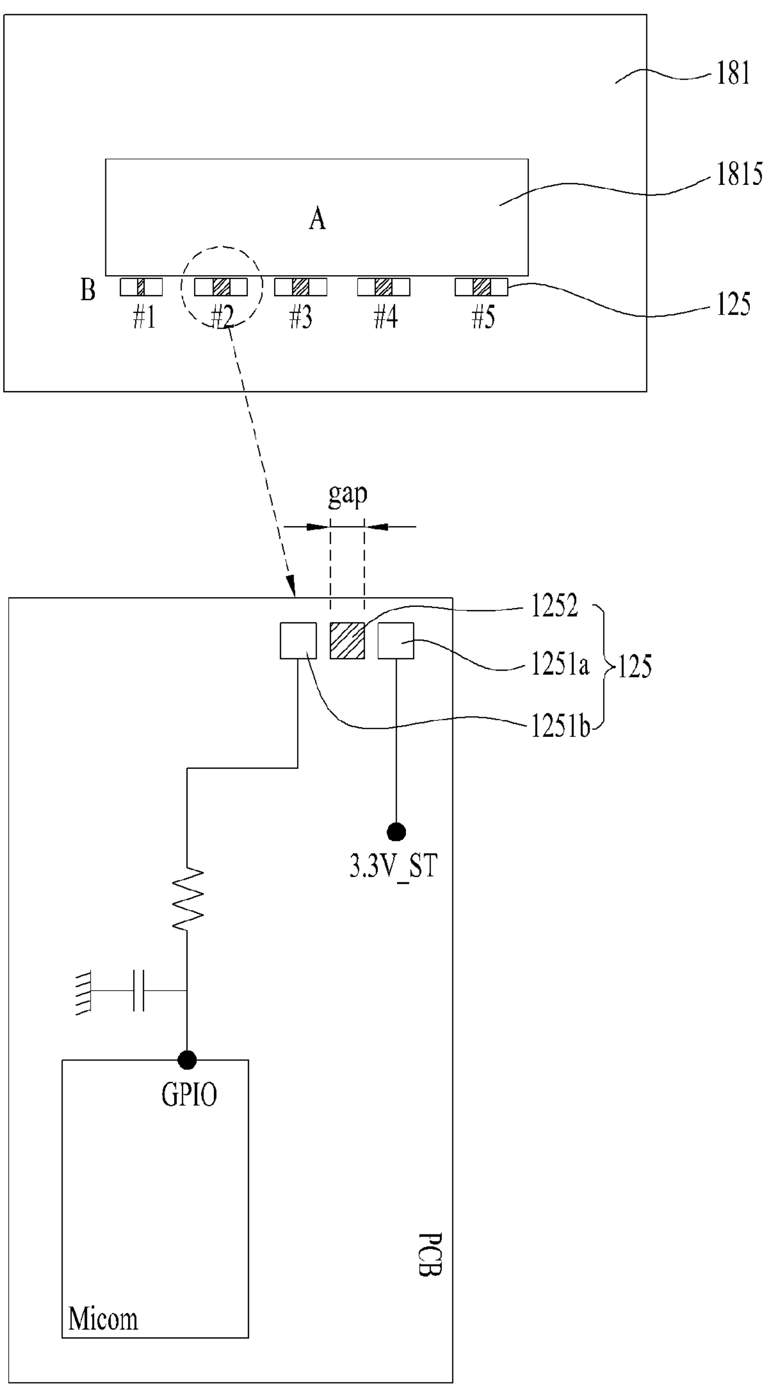
FIGS. 7 to 10 illustrate a condensation sensor of a display device, according to various embodiments of the present disclosure.
Figure 8:
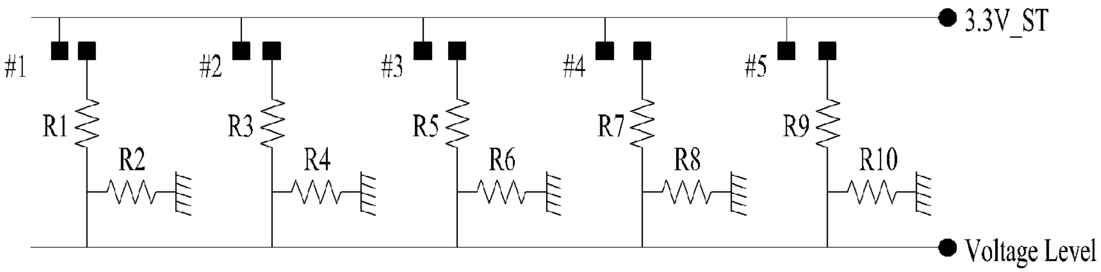

FIGS. 7 to 10 illustrate a condensation sensor 125 of the display device 100, according to various embodiments of the present disclosure. FIG. 7 is a diagram illustrating the condensation sensor 125 implemented on a circuit board 181, and FIG. 8 is a diagram illustrating a configuration of FIG. 7 in more detail.

Although described with reference to the display device 100, the condensation sensor 125 of the present disclosure may also be applied to an electronic device that does not include the display module 150.

The condensation sensor 125 includes a pair of sensor electrodes 1251 formed on the circuit board 181, and the pair of sensor electrodes 1251 form a predetermined gap 1252. One side 1251*a* of the pair of sensor electrodes 1251 is connected to a power source and the other side 1251*b* is connected to a microcomputer. The sensor electrodes 1251 are spaced apart from each other, and thus a current may not flow in a normal state, but a current may flow when moisture exists between the sensor electrodes 1251.

A photo solder resist (PSR), which is a non-modified ink may be applied to a surface of the circuit board 181 to protect a surface of the circuit board 181 and prevent solder from adhering to each other in a soldering process. The PSR has the property of preventing liquid substances from forming (water repellent), and thus the PSR at the gap 1252 between the pair of sensor electrodes 1251 of the condensation sensor 125 may be removed.

The gap 1252 from which the PSR is removed may be exposed to a metal to form a dew drop on the gap 1252. When the size of a dew drop is greater than the size of the gap 1252, a current may flow between the pair of sensor electrodes 1251, and the condensation sensor 125 may detect the dew drop.

The pair of sensor electrodes 1251 may be disposed in a horizontal direction such that dew drops are formed in the gap 1252. If the pair of sensor electrodes 1251 are disposed in a vertical direction, dew drops may flow toward the sensor electrode 1251 on one side, and thus no current may flow through the pair of sensor electrodes 1251, and dew drops may not be detected. The PSR is located at a lower portion of the gap 1252, and thus dew drops may not flow down and may be collected on the gap 1252.

The dew drops on the gap 1252 itself are sensed by the condensation sensor 125 formed on the circuit board 181, and thus the position of the condensation sensor 125 is not limited on the circuit board 181.

However, as shown in FIG. 7, condensation may easily occur on an exposed portion 1815 of a soldering portion or the sensor electrode 1251 on the circuit board 181, and thus the soldering portion or the sensor electrode 1251 may be located at a lower portion of the exposed portion, and the condensation sensor 125 may detect flowing down of the dew drops formed at an upper portion of the exposed portion.

Alternatively, the condensation sensor 125 may located at an upper end of the circuit board 181 such that dew drops formed on the cover bottom 102 formed of a metal material flow on the gap 1252.

When the size of the gap 1252 between the pair of sensor electrodes 1251 is large, the current may not flow with respect to a small dew drop, and as the size of the gap 1252 decreases, the sensing sensitivity is high. However, when an operation is blocked even in an excessively small dew drop, usability may be degraded.

As shown in FIG. 7, a plurality of condensation sensors 125 with the gaps 1252 having different sizes may be used for precise condensation sensing and control.

Referring to FIG. 8, a plurality of condensation sensors 125*a*, 125*b*, 125*c*, 125*d*, and 125*e* having different sizes of the gaps 1252 between the sensor electrodes 1251 of each condensation sensor 125 are illustrated. When a dew drop is detected in the condensation sensors 125*a* and 125*b* having the gap 1252 of 0.3 mm or less, the dew drop has a small size, and thus it may be determined that the dew drop does not significantly affect the operation of the display device 100.

The controller 180 may determine a condensation level as a low level and may not lock the operation of the display device 100, but may leave a record in a condensation history, thereby utilizing the condensation history in the future management or maintenance.

When a dew drop is detected in the condensation sensor 125*e* having a gap 1252 of 9 mm or more, the size of the dew drop may be large and the location at which the dew drop is formed may be several places, and thus, when power is applied to a product, there is a concern of failure. In this case, the display device 100 is locked so as not to drive the display device until a condensation state is improved.

When the condensation sensor 125 having a gap 1252 of more than 3 mm and less than 0.9 mm detects a dew drop, the condensation sensor 125 directly affects the driving of the display device 100, but may affect the operation when the condensation becomes severe, thereby performing a process of preventing condensation.

To prevent condensation, the display device 100 may be driven to increase the temperature, or a UI that notifies a user of a condensation risk and suggests the user drive the display device 100, move the display device 100 to an environment having a low humidity, or lower an ambient humidity may be output to a screen.

Alternatively, an alarm may be transmitted to a terminal of the user, which is operatively connected to the display device 100, to guide the user to take an action for preventing condensation. In this case, not only an alarm is simply provided but may also provide a UI or a description for guiding an action of the user to be taken to remove dew drops as described above.

Figure 9:
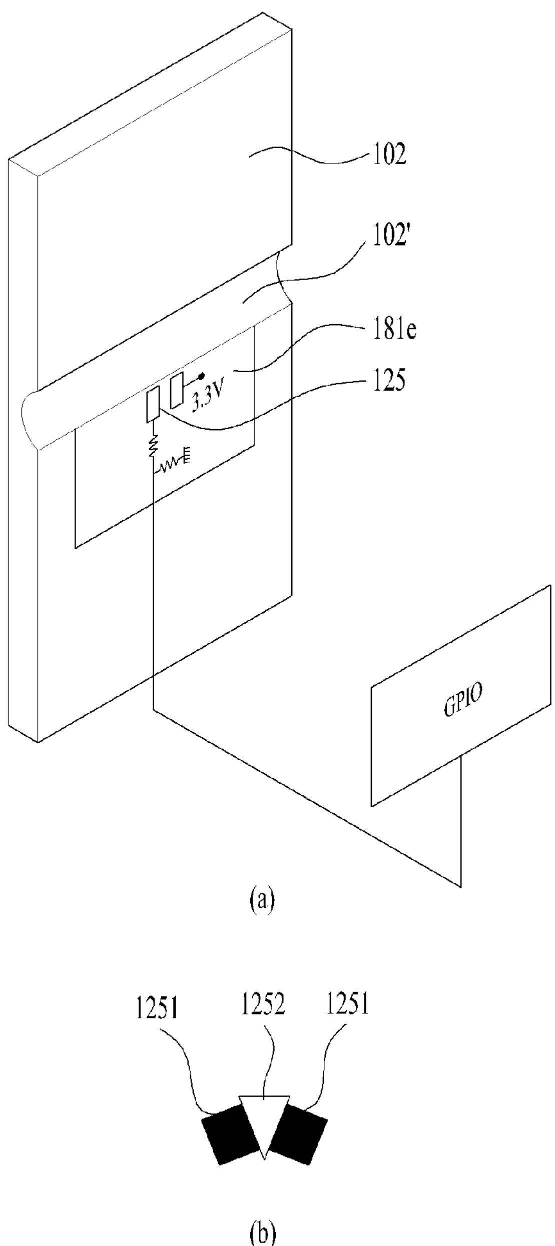

FIG. 9 is a diagram illustrating the condensation sensor 125 implemented using a separate sensor board 181. In the embodiment shown in (a) of FIG. 9, the separate sensor board 181 may be provided for the condensation sensor 125, and the condensation sensor 125 may be disposed at a portion in which there is a lot of condensation.

When the existing circuit board 181 is implemented using a spare space of the circuit board 181, the position of the condensation sensor 125 may be limited, but in the present embodiment, the condensation sensor 125 may be freely positioned.

In particular, the cover bottom 102 has a lot of condensation, the sensor board 181 may be disposed under the cover bottom 102. A condensation groove may be formed in the cover bottom 102 above the condensation sensor 125 to allow dew drops formed in the cover bottom 102 to flow to the condensation sensor 125.

Only the condensation sensor 125 is located in the sensor board 181, and thus the sensor board 181 may have a degree of freedom in design. The condensation sensor 125 may be implemented to include metal such as aluminum having a higher thermal conductivity than the circuit board 181 including copper, and thus dew drops may be easily formed on the condensation sensor 125.

As shown in the embodiment of FIG. 8, a plurality of sensor electrodes 1251 may be provided, but as shown in (b) of FIG. 9, the sensor electrode 1251 may be obliquely disposed such that the gap 1252 between the pair of sensor electrodes 1251 varies. The condensation sensor 125 having the gap 1252 of an inverted triangle shape may determine a condensation level by one condensation sensor 125.

However, when dew drops formed on the cover bottom 102 are gathered and flowing down and are detected, a condensation level is in a severe state (a state in which there is a high risk of failure), and thus when the dew drops are detected by the condensation sensor 125, driving may be immediately stopped. As shown in (a) of FIG. 9, the driving of the display device 100 may be immediately restricted (locked) when the dew drops are detected by one condensation sensor 125.

Figure 10:
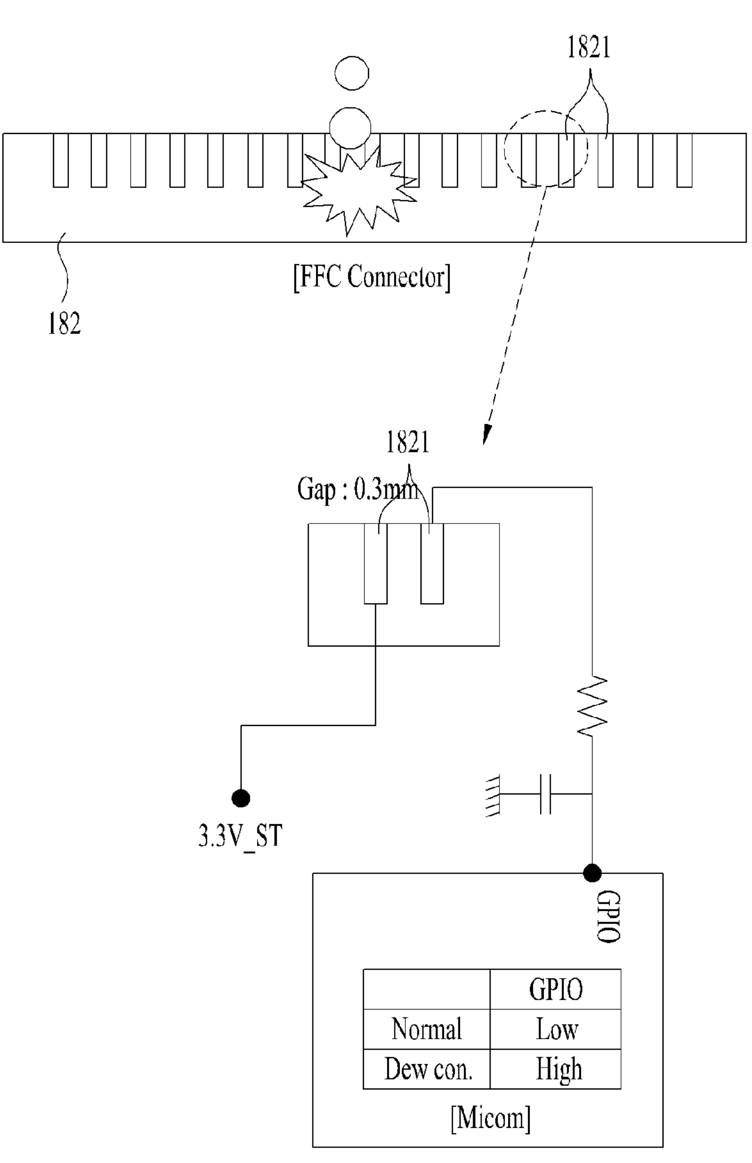

FIG. 10 shows an example of the condensation sensor 125 utilizing the cable connector 182. The cable connector 182 may include a plurality of electrodes 1821, and some of the electrodes may include an idle electrode 1821 that is not used for actual signal transmission. The condensation sensor 125 may be implemented using a pair of the idle electrodes 1821.

The spacing of the electrode 1821 of the cable connector 182 may generally be less than or equal to 1 mm, for example, 0.3 mm, 0.5 mm, and 1.0 mm when the FCC connector 182 is an FCC connector 182. A distance between the electrodes 1821 of the connector 182 corresponds to a size range of the gap 1252 between the sensor electrodes 1251 of the condensation sensor 125, and thus the electrode 1821 of the connector 182 may be used as a sensor electrode of the sensor 125 without changes.

One of the pair of electrodes 1821 may be connected to a power source, and one of the pair of electrodes 1821 may be connected to a microcomputer to detect that there is condensation when a current flows between the electrodes 1821.

The connector 182 is a path of a signal and a high-voltage flows, and thus damage to a product or a risk of fire occurs when condensation occurs. Unlike the gap 1252 between the sensor electrodes 1251 of the circuit board 181 described above, in the case of the gap 1252 between the sensor electrodes 1251 of the connector 182, dew drops may not be easily formed, and dew drops formed on the cover bottom 102 may be detected to flow down.

When a dew drop is large enough to flow down from the cover bottom 102, it may be determined that a condensation phenomenon is severe, and the driving of the display device 100 may be directly locked.

When driving of the display device 100 is locked, power is applied through the connector 182 or a signal is prevented from flowing through the connector 182 until condensation is removed. The display device 100 may be restricted to prevent damage due to a short circuit due to condensation.

Figure 11:
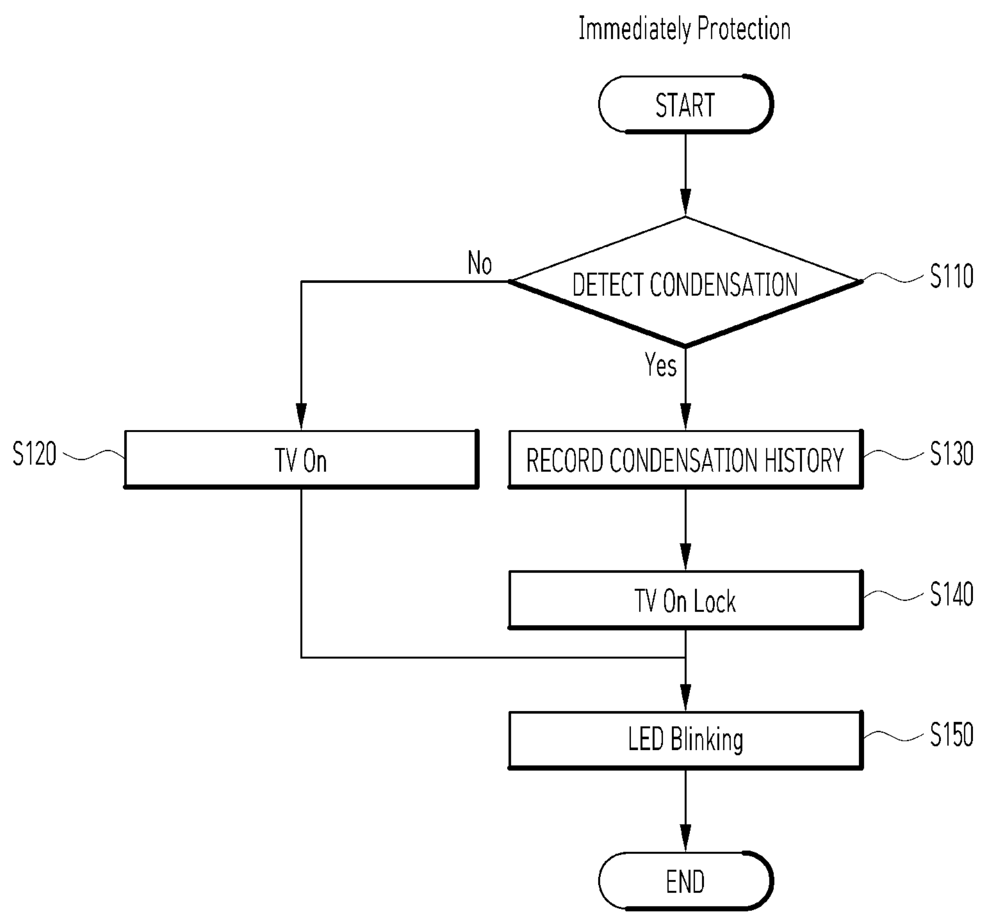
FIG. 11 is a flowchart illustrating an example of a method for sensing and controlling condensation of a display device, according to the present disclosure.
Figure 12:
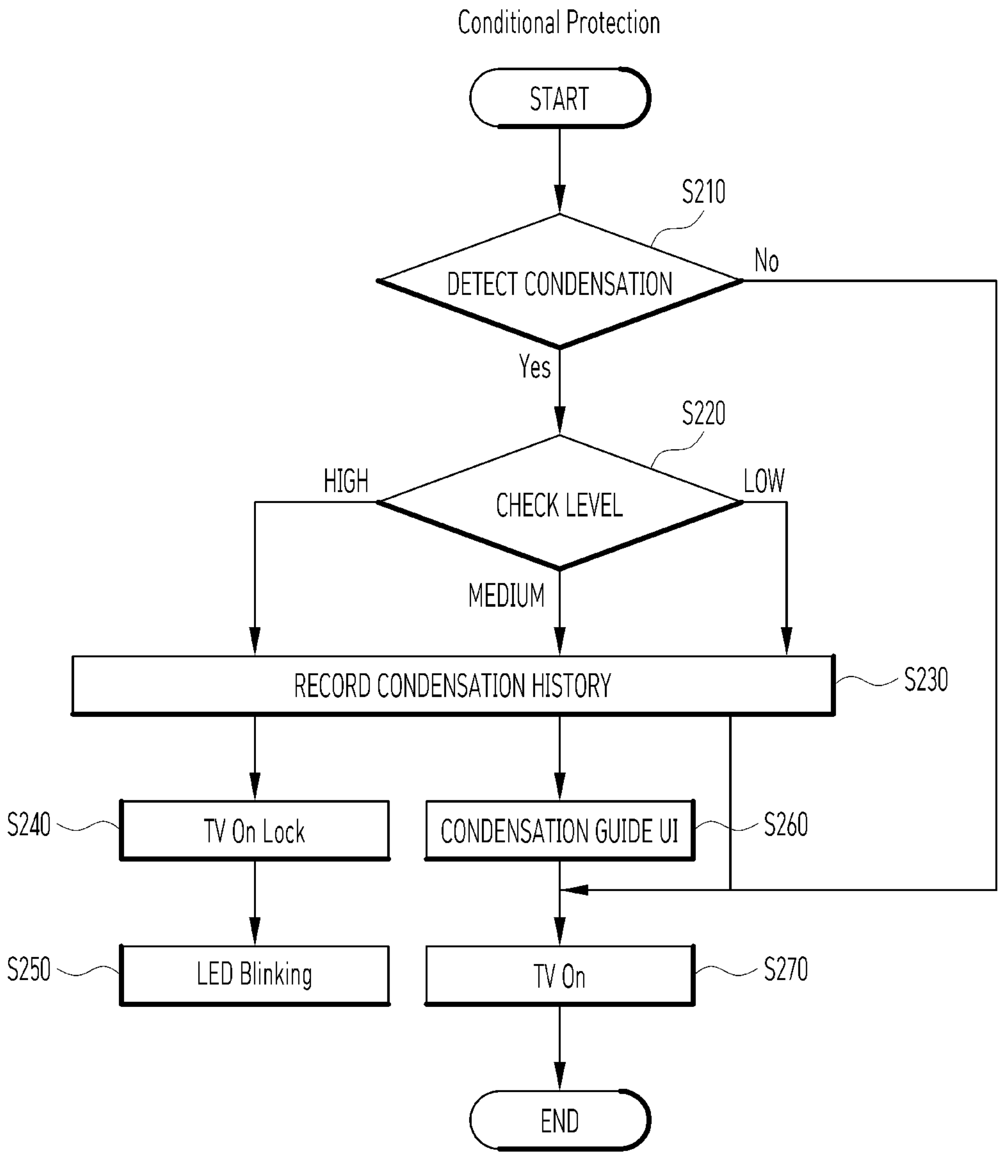
FIG. 12 is a flowchart illustrating another example of a method for sensing and controlling condensation of a display device, according to the present disclosure.

FIG. 11 is a flowchart illustrating an example of a method for sensing and controlling condensation of the display device 100, according to the present disclosure, and FIG. 12 is a flowchart illustrating another example of a method for sensing and controlling condensation of the display device 100 according to the present disclosure.

FIG. 11 shows a control method when only one condensation sensor 125 is provided as in the embodiment of FIGS. 9 and 10, and FIG. 12 shows a control method when a condensation level is to be determined through the plurality of condensation sensors 125.

Referring to FIG. 11, condensation may be detected through the condensation sensor 125 (S110), and in a state in which condensation is not sensed, the display device 100 may be normally driven (S170). When it is determined that moisture is detected between the sensor electrodes 1251 and there is condensation, a condensation history is recorded (S130), and a function is locked to prevent the display device 100 from being driven (S140).

When power is connected to the display device, the display device is in a standby mode state. The standby mode refers to a state in which a power source is connected to a TV, but the TV is not operated but only some sensors or some components are operable with minimal power, and an IR sensor is activated to allow power to be turned on by a remote controller, and the condensation sensor 125 may be activated to detect dews in a state in which the user does not use the TV.

When an ON signal for turning on the display device 100 is input, a driving voltage is output to the main board 181 and the driving substrate 181 from a power source, and the main board 181 starts booting. When the main board 181 boots, an operation signal may be output to the display module 150, and thus the user may see the screen.

The meaning of locking the display device 100 means that the power is not transmitted to the main substrate 181 or the driving substrate 181 even when the ON signal is input, and the standby state is maintained.

In a standby state, the microcomputer may operate, and the microcomputer may drive some of the sensors and the LEDs. To inform the user that the condensation is detected and the TV is in the locked state, LED blink of repeatedly turning off an LED may be repeated to inform the user that the TV is switched to the locked state due to condensation (S150).

The above condensation history may be recorded (S130) or the current is witched to the locked state (S140) and the LED driving (S150) may not necessarily be performed in the order in the flowchart, and may be performed simultaneously or in a different order.

Next, referring to FIG. 12, the present embodiment shows a control method when a condensation level is to be checked using a plurality of condensation sensors 125 as shown in FIG. 7. It is determined whether there is a condensation through the condensation sensor 125 (S210), and if there is no condensation, the display device 100 is normally driven (S270).

The condensation level may be checked based on the gap 1252 of the sensor that detects the condensation (S220). When the sensor that detects the condensation is the sensor 125*a* or 125*b* having a small gap 1252, the condensation level may be determined as a lower level.

In this case, it is determined that driving of the display device 100 does not occur due to condensation, and thus the display device 100 is normally driven (S270), but a condensation history in is recorded (S240).

When the sensor that detects the condensation is the sensor 125*c* or 125*d* having a medium gap 1252, there is no immediate problem, but it is determined that it is necessary to prevent the condensation from growing larger, and a UI to guide a method of removing the condensation is provided and output on the screen (S260).

Even in this case, the display device 100 may be normally driven (S270). When the display device 100 is driven, heat may be generated to prevent the condensation phenomenon.

Then, when the gap 1252 detects condensation on the largest sensor 125*e*, the display device 100 needs to be protected (S230), and thus a condensation history is recorded as shown in the method of FIG. 11 (S230), and a function is locked such that the display device 100 is not driven (S240). LED blink of repeatedly turning off an LED may be repeated to inform the user that the TV is switched to the locked state due to condensation (S250).

According to an embodiment of the present disclosure, condensation may be detected in a stepwise manner to prevent a damage due to condensation in advance, thereby reducing defects due to condensation.

The display device 100 according to the present disclosure may prevent malfunction or damage of the component by early sensing condensation.

It may be possible to implement a condensation sensor by utilizing an existing structure without using a component in which additional costs such as a separate moisture sensor and a temperature humidity sensor are generated, thereby minimizing addition of costs.

A condensation condition may be checked by recording a condensation history, thereby coping with the condensation.

The above detailed description should not be construed as being limitative in all terms, but should be considered as being illustrative. The scope of the present disclosure should be determined by reasonable analysis of the accompanying claims, and all changes in the equivalent range of the present disclosure are included in the scope of the present disclosure.

The invention claimed is:

1. An electronic device, comprising:

a case including a metal material;

a circuit board located on a surface of the case;

a condensation sensor including a pair of sensor electrodes formed to form a predetermined gap on the circuit board and configured to detect occurrence of condensation based on a current flowing between the sensor electrodes; and a controller configured to lock an operation of the electronic device based on detection of the condensation by the condensation sensor, wherein the condensation sensor is one of a plurality of condensation sensors with different gaps.

2. The electronic device of claim 1, wherein the gap is less than or equal to 0.1 mm and equal to or less than 1 mm.

3. The electronic device of claim 1, wherein the plurality of condensation sensors is arranged in a horizontal direction.

4. The electronic device of claim 1, wherein the plurality of condensation sensors includes:

a first condensation sensor having a first gap; and a second condensation sensor having a second gap with a smaller size than the first gap, wherein the controller is configured to lock driving of the electronic device based on detection of condensation by the first condensation sensor and provide a condensation guide to inform a user of occurrence of condensation based on detection of condensation by the second condensation sensor.

5. The electronic device of claim 4, further comprising a display module, wherein the controller drives a light source of the display module and alerts the user of a locked state of driving based on detection of condensation by the first condensation sensor.

6. The electronic device of claim 1, wherein the controller stores a condensation detection result as a condensation history based on detection of condensation by the condensation sensor.

7. The electronic device of claim 1, wherein the gap has a wide upper portion and a narrow lower portion.

8. The electronic device of claim 1, wherein a surface of the circuit board includes a photo solder resist (PSR), and the PSR is removed from the gap.

9. The electronic device of claim 1, wherein the condensation sensor is located below a portion of the circuit board, through which soldering or a copper foil is exposed.

10. The electronic device of claim 1, wherein the circuit board further includes a sensor board located below the case, and the condensation sensor is located at an upper end of the sensor board.

11. The electronic device of claim 10, wherein the case further includes a condensation groove located above the sensor board.

12. The electronic device of claim 10, wherein the sensor board includes a material with a higher thermal conductivity than copper.

13. The electronic device of claim 1, further comprising a cable connector located on the circuit board and including a plurality of electrodes, wherein a sensor electrode of the condensation sensor is a pair of electrodes located on the connector.

* * * * *